United States Patent [19]

Miller

[11] Patent Number: 4,549,782
[45] Date of Patent: Oct. 29, 1985

[54] ACTIVE OPTICAL FIBER TAP

[75] Inventor: Stewart E. Miller, Locust, N.J.

[73] Assignee: AT&T Bell Laboratories, Murray Hill, N.J.

[21] Appl. No.: 501,716

[22] Filed: Jun. 6, 1983

[51] Int. Cl.$^4$ .............................. G02B 5/14; H04B 9/00
[52] U.S. Cl. .................................. 350/96.16; 250/227; 350/96.15; 357/19
[58] Field of Search ................... 350/96.15, 96.16; 455/612, 610; 357/19; 250/227

[56] References Cited

U.S. PATENT DOCUMENTS

| 4,112,293 | 9/1978 | Käch | 350/96.16 X |
| 4,130,343 | 12/1978 | Miller et al. | 350/96.15 |
| 4,136,929 | 1/1979 | Suzaki | 350/96.15 |
| 4,152,713 | 5/1979 | Copeland, III et al. | 357/19 |
| 4,310,217 | 1/1982 | de Mendez et al. | 350/96.16 |

FOREIGN PATENT DOCUMENTS

| 2525777 | 10/1983 | France | |
| 52-17837 | 2/1977 | Japan | 350/96.15 |
| 53-29740 | 3/1978 | Japan | 350/96.15 |
| 53-84586 | 7/1978 | Japan | 350/96.11 |

OTHER PUBLICATIONS

Bachtold et al., "Integrated Bidirectional Fiber-Optic Repeater," *IBM Tech. Discl. Bull.*, vol. 23, No. 11, Apr. 1981, pp. 5145–5146.
Bell System Technical Journal, Feb. 1982, vol. 61, No. 2, "Fail-Safe Nodes for Lightguide Digital Networks-A. Albanese, (pp. 247–251).
Optics & Laser Technology, Feb. 1982, "LEDs and Photodetectors for Wavelength-Division-Multiplexed-Light-Wave Systems"-T. P. Lee, (pp. 15–20).

*Primary Examiner*—John Lee
*Attorney, Agent, or Firm*—Sylvan Sherman; Eugen E. Pacher

[57] ABSTRACT

An active tap for use in an optical multiple access network is disclosed. The tap comprises a semiconductor substrate on which the electronics associated with an active parallel path are fully integrated. These include optical detectors, amplifiers and light emitters formed using standard semiconductor fabrication techniques. A section of fiber, incorporated as an integral part of the tap structure, is provided with a pair of longitudinally spaced discontinuities for deflecting a portion of the incident signal onto the detector and for redirecting the output from the light emitter along the through-path. Alternatively, the tap substrate can be provided with a groove for receiving a fiber segment located anywhere along the distribution network.

9 Claims, 6 Drawing Figures

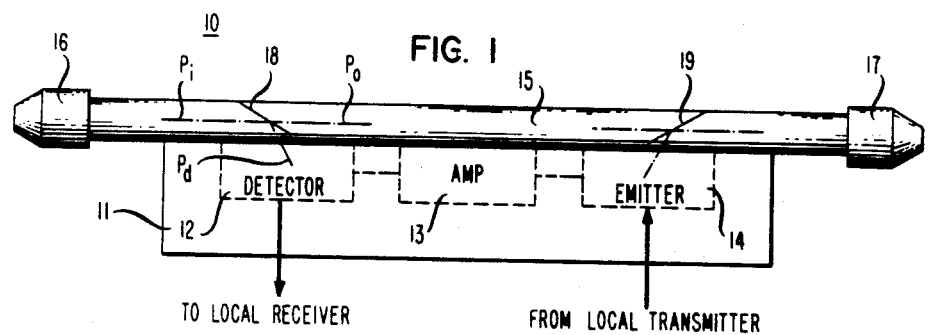
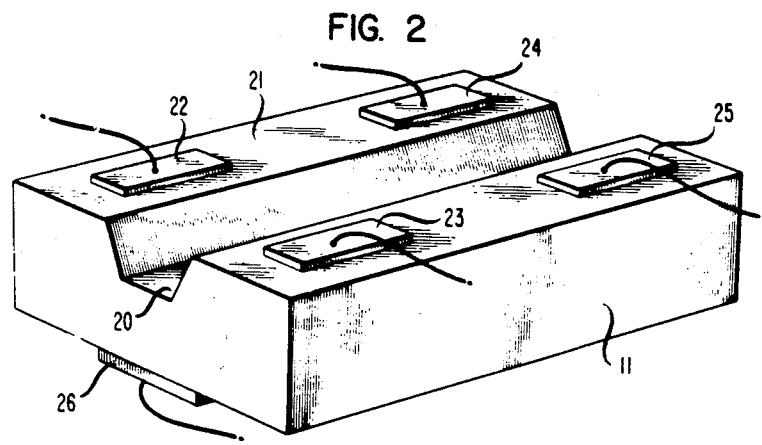
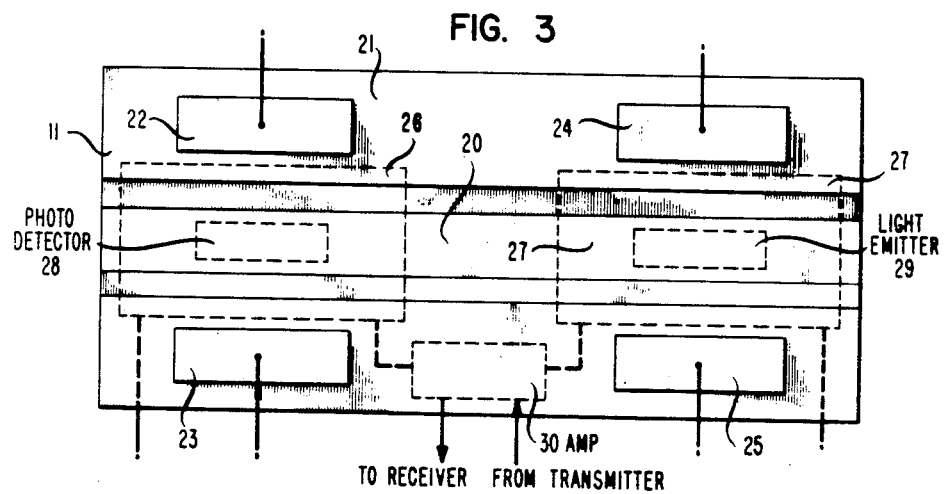

4,549,782

ACTIVE OPTICAL FIBER TAP

TECHNICAL FIELD

This invention relates to multiple-access optical networks and, in particular, to active taps for use in such networks.

BACKGROUND OF THE INVENTION

Low-loss taps are essential if optical fibers are to be used in multiple-access, local area distribution networks. At each node in such networks, a tap must extract a portion of the through-signal. This, however, has the effect of significantly reducing the level of the remaining signal. For example, if one-quarter of the incident signal is extracted, then there is a 1.25 db loss in the remaining through-signal which severely limits the number of nodes that can be placed along the network. Simultaneously, the tap must also couple a local transmitter to the network. If the coupling coefficient of the second coupler is made low in an effort to reduce the loss along the through-path, the efficiency with which the local transmitter is coupled to the network is similarly reduced. This, in turn, increases the output power requirements of the transmitter.

These various conflicting requirements are satisfied by using active taps in which a portion of the power extracted at each node is amplified in a parallel path and then reinjected into the network. This makes it possible to reduce the losses at each node to zero. (See, for example, the article by A. Albanese entitled "Fail-Safe Nodes for Lightguide Digital Networks" published in the February 1982 issue of the *Bell System Technical Journal*, Vol. 61, No. 2; and U.S. Pat. No. 4,310,217.) To be commercially practical, however, the tap must also be inexpensive, and conveniently packaged for easy field installation.

SUMMARY OF THE INVENTION

An active optical tap, in accordance with the present invention, comprises a semiconductor substrate on which the electronics associated with an active parallel path are fully integrated. These include optical detectors, amplifiers and light emitters formed using standard semiconductor fabrication techniques. A section of fiber, incorporated as an integral part of the tap structure, is provided with a pair of longitudinally spaced discontinuities for deflecting a portion of the incident signal onto the detector and for redirecting the output from the light emitter along the through-path. Alternatively, the tap substrate can be provided with a groove for receiving a fiber segment located anywhere along the distribution network.

BRIEF DESCRIPTION OF THE DRAWING

FIG. 1 shows, in block diagram, an active tap in accordance with the present invention;

FIG. 2 shows details of the semiconductor substrate upon which the various circuit elements are integrated;

FIG. 3 is a plan view of the substrate of FIG. 2;

DETAILED DESCRIPTION

Figure 4:
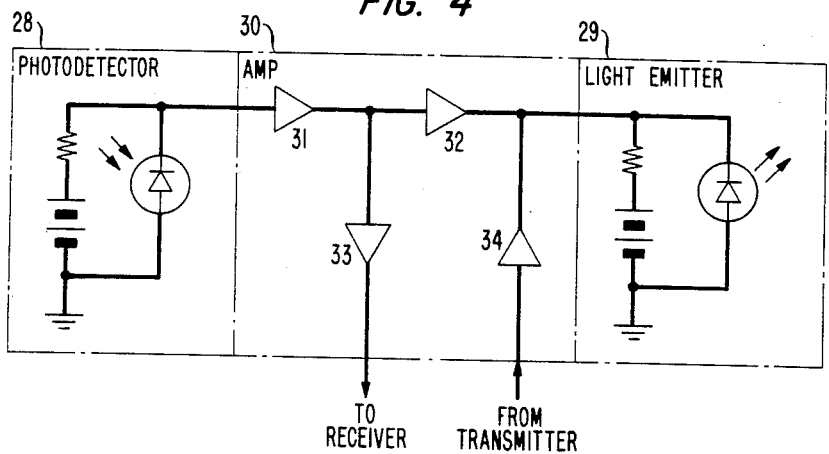
FIG. 4 is an illustrative circuit diagram of the active signal path.

Referring to the drawings, FIG. 1 shows, in block diagram, a node configuration including an active optical tap 10 in accordance with the present invention. As illustrated, the tap comprises a semiconductor substrate 11 on which there is formed an optical detector 12, an amplifier 13 having one or more stages, and an optical emitter 14. An optical fiber 15, embedded along the upper surface of the semiconductor substrate 11, is provided with a pair of longitudinally spaced couplers 18 and 19 which provide coupling between fiber 15 and a local receiver and transmitter (not shown).

In operation, a portion, $P_d$, of the incident signal, $P_i$, propagating along fiber 15 is coupled out of the fiber by means of coupler 18. Signal portion $P_d$ is detected by optical detector 12 whose output is coupled to the local receiver. The balance of the signal, $P_o = P_i - P_d$, then traverses coupler 19 which serves to couple a portion of the local transmitter signal onto fiber 15.

Assuming for purposes of illustration and explanation that $P_d = 0.25 P_i$, then at best, in a passive tap, $P_o = 0.75 P_i$, which is equivalent to a 1.25 dB loss at coupler 18. If it is further assumed that coupler 19 is the same as coupler 18, the through-signal experiences a further 1.25 dB loss, for a total loss of 2.50 dB at each node in the network. This, as noted above, would severely limit the number of nodes that could be used.

To avoid this limitation, a portion of the detector output is amplified in amplifier 13 which, in turn, drives optical emitter 14. The latter reinjects a signal into fiber 15 which, when added to the through-signal in the fiber, compensates for any loss produced in couplers 18 and 19. The result is to produce zero loss or, if desired, a net gain for the through-signal at each node.

In order for this technique to be commercially attractive, the entire tap assembly must be conveniently packaged and inexpensive. These practical considerations are met, in accordance with the present invention, by integrating the entire tap assembly as indicated in the illustrative embodiment shown in FIGS. 2 and 3.

FIG. 2, now to be considered, shows the semiconductor substrate 11 including a fiber groove 20 extending along the upper substrate surface 21, and an array of conductive contacts, of which contacts 22, 23, 24, 25 and 26 are shown. FIG. 3 is a plan of the embodiment of FIG. 2 showing groove 20 and the conductor pairs 22-23 and 24-25 located on upper surface 21 of substrate 11. Pair 22-23 and contact 26, located along the lower substrate surface, operate in conjunction with a photodetector 28 (shown in broken line) that is formed along groove 20. The second contact pair 24-25 and a second contact 27, located along the lower surface of substrate 11, operate in conjunction with a light emitter 29 (shown in broken line), similarly formed along groove 20. Detector 28 can be a PIN diode or an avalanche photodiode fabricated in substrate 11. Light emitter 29 can be either an LED or an injection laser. (See, for example, "LEDs and photodetectors for wavelength-division-multiplexed light-wave systems" by T. P. Lee, published in the February 1982 issue of *Optics and Laser Technology*, pp. 15-20).

Situated between, and connected to the detector and emitter is amplifier 30 which provides the gain in the parallel path.

FIG. 4 is an illustrative circuit diagram of the electronics showing photodetector 28, light emitter 29 and amplifier 30 including two stages of gain 31 and 32, and isolation amplifiers 33 and 34 for connecting between amplifier 30 and the local receiver and transmitter, respectively.

The tap can be provided with a length of fiber that is glued within groove 20 and whose ends are fitted with connectors 16 and 17, as illustrated in FIG. 1. Alternatively, the tap can be made without the fiber segment and simply glued to the network fiber anywhere along its length. This avoids the necessity for cutting into the fiber. In either case, the fiber is provided with coupling means for coupling into and out of the fiber.

Figure 5:
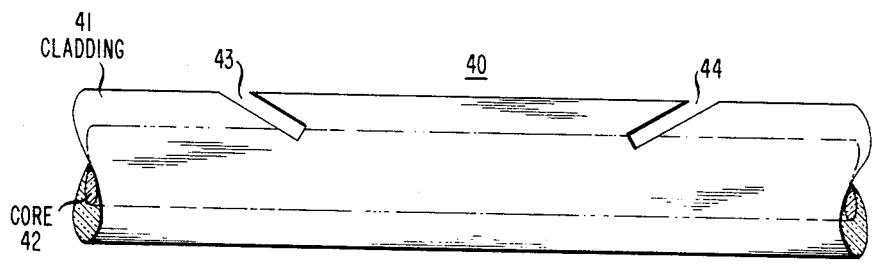
FIGS. 5 and 6 show details of the optical couplers for coupling between the optical fiber and the active signal path.

FIG. 5, now to be considered, shows a convenient way for providing such coupling. In this embodiment, coupling is provided by means of a pair of notches 43 and 44 cut into a fiber 40 which comprises an inner core region 42 surrounded by an outer cladding 41 of lower refractive index. The depth of the notch determines the amount of optical power deflected. The notches can be formed by mounting the fiber on the tap assembly and then placing a mask over the fiber, exposing the latter in the region of the desired notches. The notches are then formed by a reactive ion etching process. The angle of the notch is controlled by tilting the entire assembly.

Figure 6:
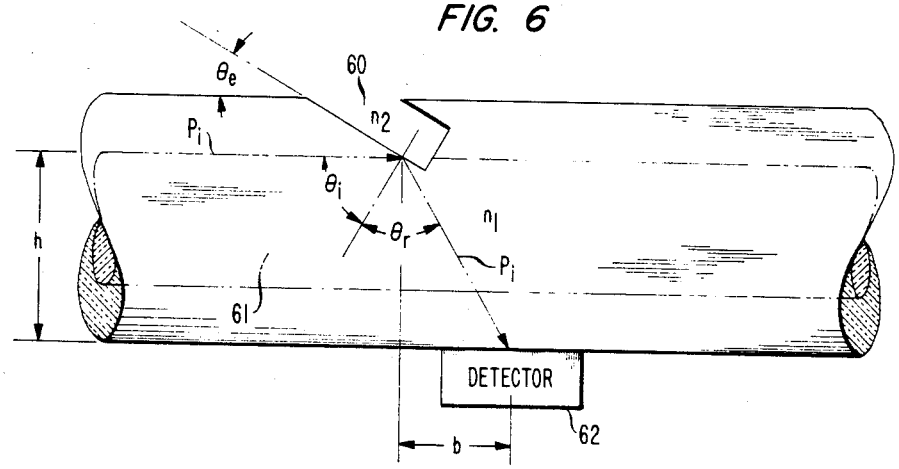

FIG. 6, included for purposes of explanation, shows in greater detail the manner in which the notches serve to couple between the through-path and the parallel active path. With notch 60 extending into the core region 61 of the fiber, total internal reflection occurs when the angle of incidence $\theta_i$ of the portion of the signal intercepted by the notch is given by $$\theta_i \geq \sin^{-1}(n_2/n_1)$$

where $n_1$ and $n_2$ are the refractive indices of the core and notch, respectively.

For air ($n_2 = 1$) and a typical core ($n_1 = 1.5$), $\theta_i$ is 41.8°. Thus, with the plane of the notch inclined at angle $\theta_e \leq 90 - \theta_i$, or less than about 48°, an efficient reflector is obtained. Advantageously, an angle of less than 48° is used so as to longitudinally displace the detector relative to the notch. This serves to reduce the possibility of obtaining feedback due to the scattering by the notch of light which was injected into the fiber by the emitter. For example, a typical fiber has an outside diameter of about 125 μm and a core diameter of 50 μm. Thus, the distance, h, between the notch and the detector is about 75 μm. If $\theta_e$ is made equal to 22.5°, the detector offset, b, is also 75 μm. Further assuming that the radius of the detector is about 50 μm, the entire detector would be downstream of the notch. Thus, relatively little light from the emitter, incident upon notch 60 from the right, would reach the detector.

It will be recognized that the use of a notch for coupling is merely illustrative and that other coupling configurations can be used for the described purpose. It will also be noted that there is a finite delay through the active parallel path. Accordingly, if the reinjected signal is to combine in time coincidence with the through-signal, this delay should be small compared with the period of the highest frequency modulation component.

What is claimed is:

1. An active optical fiber tap comprising:
   (a) means for positioning in fiber holding means a portion of an optical fiber adapted for longitudinally guiding first electromagnetic radiation, the portion of the fiber comprising a first region and a second region, the first region comprising means for causing emission of some of the first radiation from the fiber, the second region comprising means for causing coupling of second electromagnetic radiation into the fiber;
   (b) means for detecting at least some of the first radiation emitted from the fiber portion, the detecting means having an output;
   (c) radiation source means comprising means for modulating the emission of the radiation therefrom, the emitted radiation being the second radiation, at least a part of the second radiation to be coupled into the optical fiber;
   (d) means for amplifying the output of the detecting means, the amplifying means having an input and an output, the output of the detecting means being connected to the input of the amplifying means, the output of the amplifying means being connected to the means for modulating the second radiation emission; and
   (e) means for extracting an output signal from the optical fiber tap;
   (f) wherein the fiber holding means comprise a semiconductor substrate comprising means for attaching thereto the portion of the optical fiber, and wherein the detecting means, the amplifying means, and the second radiation source means all comprise semiconductor devices integrated into the substrate.

2. Optical fiber tap of claim 1, further comprising means for applying an external modulating signal to the radiation-modulating means.

3. Optical fiber tap of claim 1, wherein the means for attaching a portion of an optical fiber comprise a groove extending along one of the surfaces of the substrate.

4. Optical fiber tap of claim 3, including a length of optical fiber, a portion of the optical fiber located in the groove and attached to the substrate, the portion of the optical fiber comprising the first region and the second region.

5. Optical fiber tap of claim 4, wherein the means for causing emission of first radiation comprise a first notch in the optical fiber, the notch having a first surface making an angle $\phi_e$ with the axis of the optical fiber, the notch filled with a medium having a refractive index $n_2$.

6. Optical fiber tap of claim 5, wherein the optical fiber comprises a core region of refractive index $n_1$, the core region surrounded by a cladding of refractive index less than $n_1$, the notch extending through the cladding into the core region, with the angle $\phi_e$ being less than $90° - \sin^{-1}(n_2/n_1)$.

7. Optical fiber tap of claim 5, wherein the means for causing coupling of second radiation into the fiber comprise a second notch in the optical fiber, the optical fiber tap has a signal flow direction, and the second notch is downstream from the first notch.

8. An optical fiber communications network comprising at least one optical fiber tap according to claim 1.

9. Network of claim 8, wherein the second radiation is coupled into the optical fiber so as to be substantially in synchrony with the first radiation.

* * * * *